(12) United States Patent
Holt et al.

(10) Patent No.: US 9,006,052 B2
(45) Date of Patent: Apr. 14, 2015

(54) SELF ALIGNED DEVICE WITH ENHANCED STRESS AND METHODS OF MANUFACTURE

(75) Inventors: Judson R. Holt, Wappingers Falls, NY (US); Viorel C. Ontalus, Danbury, CT (US); Keith H. Tabakman, Fishkill, NY (US)

(73) Assignee: International Business Machines Corporation, Armonk, NY (US)

( * ) Notice: Subject to any disclaimer, the term of this patent is extended or adjusted under 35 U.S.C. 154(b) by 243 days.

(21) Appl. No.: 12/901,733

(22) Filed: Oct. 11, 2010

(65) Prior Publication Data

US 2012/0086046 A1 Apr. 12, 2012

(51) Int. Cl.
H01L 21/00 (2006.01)
H01L 29/786 (2006.01)
H01L 29/66 (2006.01)
H01L 29/78 (2006.01)

(52) U.S. Cl.
CPC .... *H01L 29/78654* (2013.01); *H01L 29/66553* (2013.01); *H01L 29/66651* (2013.01); *H01L 29/66772* (2013.01); *H01L 29/7848* (2013.01); *H01L 29/78618* (2013.01)

(58) Field of Classification Search
CPC .................. H01L 29/66553; H01L 29/66651; H01L 29/7848; H01L 29/78618
USPC .................. 438/149, 151, 163, 164, 197, 299
See application file for complete search history.

(56) References Cited

U.S. PATENT DOCUMENTS

| | | | |
|---|---|---|---|
| 6,583,000 B1 | 6/2003 | Hsu et al. | |
| 6,593,641 B1 | 7/2003 | Fitzergald | |
| 6,602,757 B2 * | 8/2003 | Hovel et al. | 438/407 |
| 6,864,540 B1 | 3/2005 | Divakaruni | |
| 6,921,711 B2 | 7/2005 | Cabral, Jr. et al. | |
| 7,037,770 B2 | 5/2006 | Chidambarrao et al. | |
| 7,422,936 B2 | 9/2008 | Barns et al. | |
| 7,560,326 B2 * | 7/2009 | Mocuta et al. | 438/197 |
| 7,687,354 B2 * | 3/2010 | Grudowski et al. | 438/282 |
| 7,741,167 B2 * | 6/2010 | Beyer et al. | 438/199 |
| 2007/0205468 A1 | 9/2007 | Yeo et al. | |
| 2008/0119019 A1 | 5/2008 | Han et al. | |
| 2008/0233725 A1 | 9/2008 | Forbes | |
| 2009/0294894 A1 | 12/2009 | Dyer | |
| 2010/0009502 A1 | 1/2010 | Tan et al. | |
| 2010/0078691 A1 | 4/2010 | Mulfinger et al. | |

OTHER PUBLICATIONS

Mayuzumi et al., "Channel-Stress Study on Gate-Size Effects ... and eSiGe", IEEE, 2008 Symposium on VLSI Technology Digest of Technical Papers, pp. 126-127.
Simoen et al., "On the Low-Frequency Noise of ... Metal Gate", IEEE Electron Letters, vol. 28, No. 11, Nov. 2007, pp. 987-989.
Final Office Action dated May 13, 2013 in U.S. Appl. No. 13/474,257, 12 pages.
Office Action dated Jan. 18, 2013 in U.S. Appl. No. 13/474,257, 9 pages.
Office Action dated Jun. 30, 2014 in U.S. Appl. No. 13/474,257, 9 pages.
Final Office Action dated Oct. 28, 2014 in U.S. Appl. No. 13/474,257; 16 pages.

* cited by examiner

*Primary Examiner* — Jay C Kim
(74) *Attorney, Agent, or Firm* — Steven Meyers; Roberts, Mlotkowski, Safran & Cole, P.C.

(57) ABSTRACT

A method includes forming a stressed Si layer in a trench formed in a stress layer deposited on a substrate. The stressed Si layer forms an active channel region of a device. The method further includes forming a gate structure in the active channel region formed from the stressed Si layer.

19 Claims, 10 Drawing Sheets

SELF ALIGNED DEVICE WITH ENHANCED STRESS AND METHODS OF MANUFACTURE

FIELD OF THE INVENTION

The invention relates to semiconductor structures and methods of manufacture and, more particularly, to self aligned devices with enhanced stress and methods of manufacture.

BACKGROUND

In the recent generations of technology, stress engineering and material innovations have replaced geometric scaling as the main contributors to the continued performance improvement in CMOS devices. For example, strained Si has been adopted as a promising option to improve complementary metal oxide semiconductor (CMOS)-based transistor device performance. More specifically, strained silicon on insulator (SSOI) technology is a promising way to increase charge carriers mobility in CMOS technologies such as, for example, FinFET, frigate, ultrathin body SOI and nanowires.

However, current methods to fabricate SSOI wafers are very expensive. For example, current manufacturing technologies require several masking layers in order to provide a stress material thereby increasing overall fabrication costs. Moreover, with smaller technology nodes, it becomes very difficult to obtain proper spacing between the S/D regions and the gate stack. Also, extremely close proximity in early embedded SiGe leads to highly variable devices since the location of device tailoring implants moves as a function of fill height. Also, integrating the stressors, with a controlled device and a replacement gate-flow high-k metal gate stack is expensive and complicated.

Accordingly, there exists a need in the art to overcome the deficiencies and limitations described hereinabove.

SUMMARY

In a first aspect of the invention, a method comprises forming an epitaxial stress layer on a substrate. The method further comprises forming a masking layer on the epitaxial stress layer and providing an opening therein. The method further comprises forming a trench in the epitaxial stress layer through the opening of the masking layer. The method further comprises embedding a Si layer in the trench of the epitaxial stress layer, through the opening in the masking layer. The Si layer, which forms an active channel region of the gate structure, has a stress imposed thereon by the epitaxial stress layer. The method further comprises forming a gate structure on the Si layer and within the opening formed in the masking layer.

In another aspect of the invention, a method comprises forming a stressed Si layer in a trench formed in a stress layer deposited on a substrate. The stressed Si layer forms an active channel region of a device. The method further comprises forming a gate structure in the active channel region formed from the stressed Si layer.

In yet another aspect of the invention, a structure comprises a stressed Si layer in a trench formed in a stress layer deposited on a substrate. The stressed Si layer is an active channel region of a device and the stress layer has a lattice constant different than the stressed Si layer. The structure further comprises a gate structure formed in the active channel region formed from the stressed Si layer. The gate structure comprises a dielectric material formed on the stressed Si layer, a gate body and spacers formed on the side of the gate body.

In another aspect of the invention, a design structure tangibly embodied in a machine readable storage medium for designing, manufacturing, or testing an integrated circuit is provided. The design structure comprises the structures of the present invention. In further embodiments, a hardware description language (HDL) design structure encoded on a machine-readable data storage medium comprises elements that when processed in a computer-aided design system generates a machine-executable representation of the self aligned device with enhanced stress, which comprises the structures of the present invention. In still further embodiments, a method in a computer-aided design system is provided for generating a functional design model of the self aligned device with enhanced stress. The method comprises generating a functional representation of the structural elements of the self aligned device with enhanced stress.

BRIEF DESCRIPTION OF THE SEVERAL VIEWS OF THE DRAWINGS

The present invention is described in the detailed description which follows, in reference to the noted plurality of drawings by way of non-limiting examples of exemplary embodiments of the present invention.

DETAILED DESCRIPTION

The invention relates to semiconductor structures and methods of manufacture and, more particularly, to self aligned devices with enhanced stress and methods of manufacture. In embodiments, the active device channel is embedded within stressor material such as, for example, SiGe or SiC. Advantageously, the gate stack can be formed in a same masking layer, or additional spacers can be formed to provide very exact spacings between the S/D regions and the gate stack. Moreover, in embodiments, the embedded Si leads to highly precise device fabrication since the location of device tailoring implants do not move as a function of fill height. Also, by embedding the Si layer into the stressor material, it is advantageously possible to create a device that is controlled by in situ doping rather than implant. Advantageously, it is also possible to create the device and gate stack in the same cut-out thereby reducing overall fabrication costs.

Figure 1:
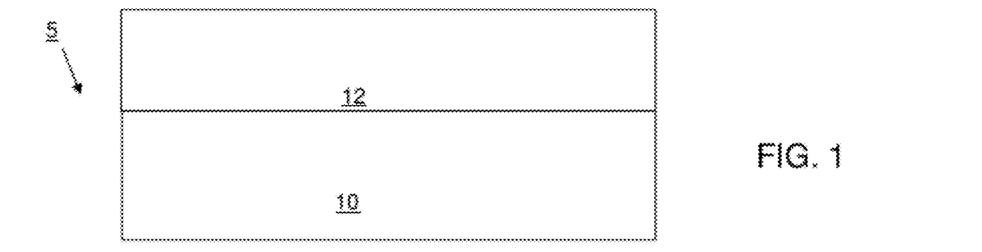
FIGS. 1-7 show structures and respective processing steps in accordance with accordance with aspects of the invention.

FIGS. 1-7 show structures and respective processing steps in accordance with accordance with aspects of the invention. Specifically, FIG. 1 shows a beginning structure comprising silicon on insulator (SOI) substrate 5. The substrate 5 includes a silicon film 12 bonded or deposited to a oxide or other insulator layer 10.

Figure 2:
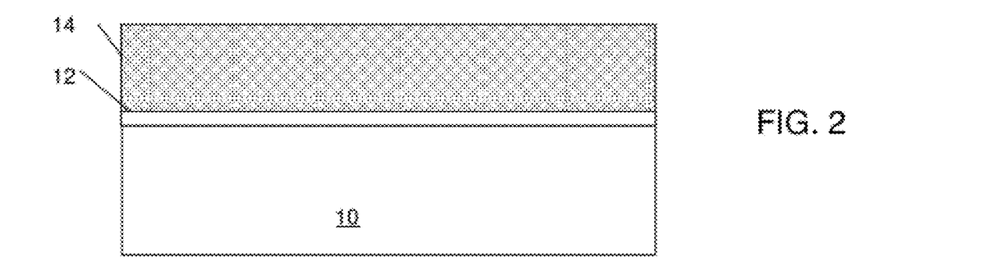

As shown in FIG. 2, the silicon film 12 can be thinned by conventional processes. For example, a reactive ion etching (RIE) can be performed to thin the silicon film 12. In embodiments, the thickness of the silicon film 12 can be about 10 nm to about 40 nm. An epitaxial stressor material 14 can be deposited on the silicon film 12. In embodiments, the epitaxial stressor material 14 can be deposited to a thickness of about 20 nm to about 70 nm. In embodiments, the epitaxial stressor material 14 can be deposited using conventional deposition methods such as, for example, chemical vapor deposition (CVD). In embodiments, the epitaxial stressor material 14 can be, for example, SiGe to create a compressive stress for a PFET device or a SiC to create a tensile stress for an NFET device. As in all embodiments, the epitaxial stressor material 14 can be other materials which have a lattice mismatch with an active device region.

Figure 3:
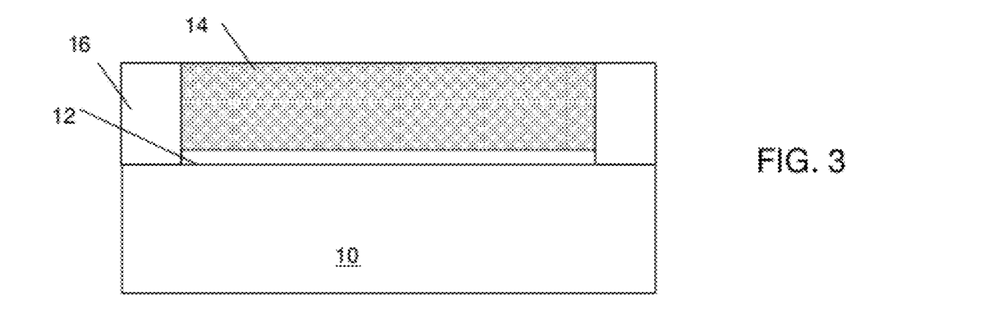

In FIG. 3, isolation regions 16 are defined in the structure. More specifically, the isolation regions 16 can be formed using conventional lithographic, etching and deposition processes. For example, a resist can be deposited on the structure of FIG. 2, and exposed to light to form a pattern (openings). A RIE can then be performed to open trenches in the epitaxial stressor material 14 and silicon film 12, exposing the underlying oxide layer or other insulator material 10. In embodiments, an oxide or other insulator material is formed (e.g., deposited) in the trenches to form the isolation regions. The resist can then be stripped using conventional processes.

It should be understood by those of skill in the art that the isolation regions 16 can also be performed prior to the thinning of the silicon film 12. If the isolation regions 16 are formed at this fabrication stage, the silicon film 12 can then be thinned, and the epitaxial stressor material 14 deposited on the silicon film 12 between the isolation regions 16. This alternative option is shown, for example, in FIG. 14.

Figure 4:
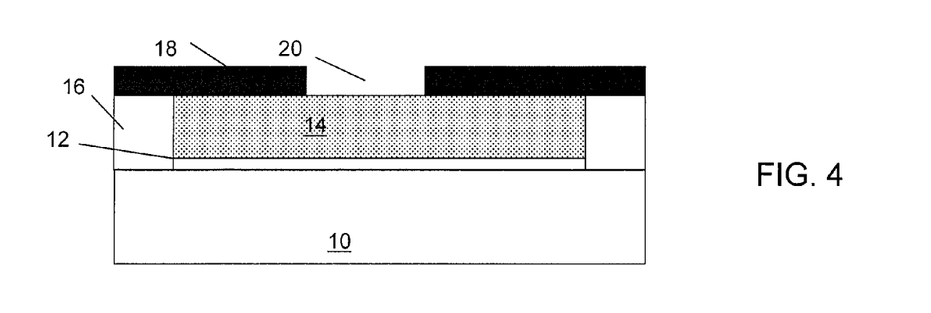

In FIG. 4, a hardmask 18 is placed over the isolation regions 16 and the epitaxial stressor material 14. In embodiments, the hardmask 18 can be deposited over the isolation regions 16 and the epitaxial stressor material 14. The hardmask 18 can be, for example, a nitride, oxide or multi-layer mask. A pattern (opening) 20 is formed in the hardmask 18 using conventional lithographic and etching processes. The etching process can be, for example, a RIE or wet etching process, known to those of skill in the art. The size of the opening 20 can vary, depending on the size of the transistor.

Figure 5:
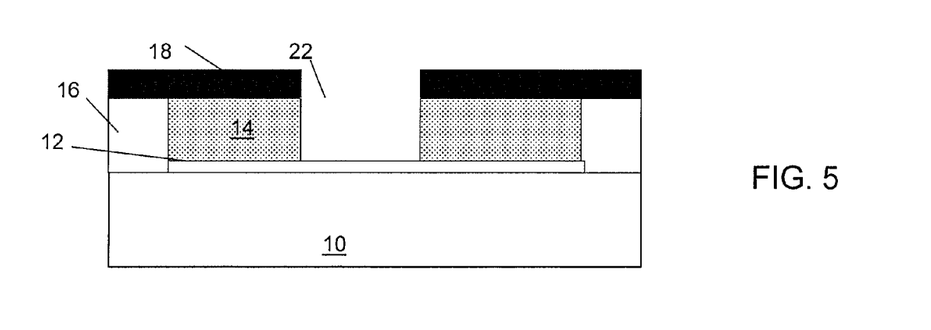

As shown in FIG. 5, a trench 22 is formed in the epitaxial stressor material 14. The trench 22 exposes the underlying silicon film 12. In embodiments, the trench 22 can be formed by conventional plasma etching or RIE techniques.

Figure 6:
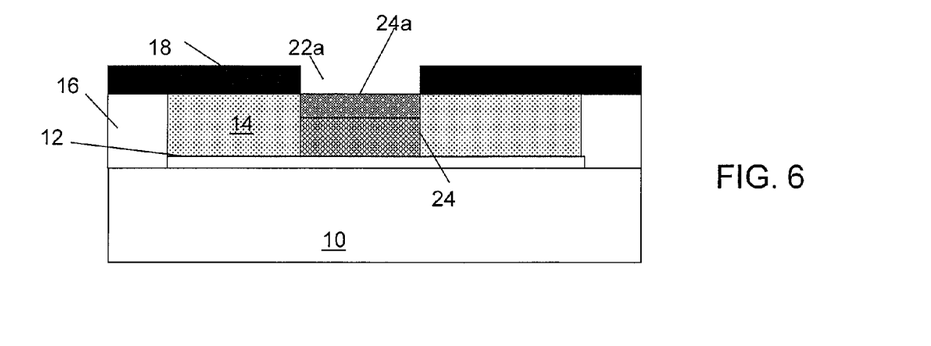
Figure 7:
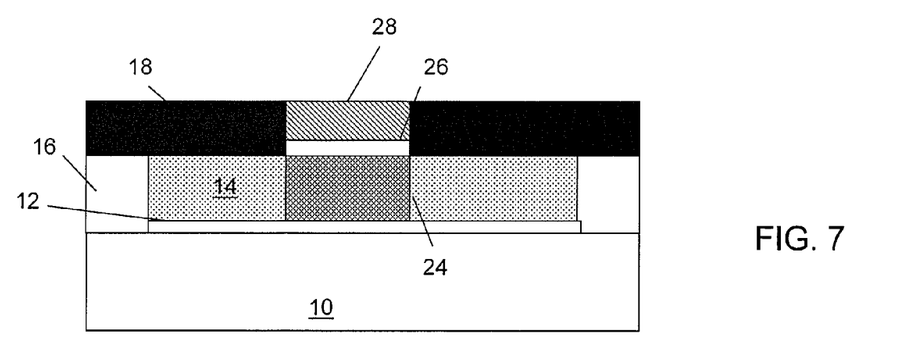

In FIG. 6, a Si layer 24 is grown in the trench 22 to form an embedded Si island. In embodiments, the growth of the Si layer (embedded Si island) 24 will result in a portion 22a of the trench remaining for subsequent gate formation. In embodiments, a stress is imposed on the Si layer (embedded Si island) 24 as it is surrounded by the epitaxial stressor material 14. In embodiments, the Si layer (embedded Si island) 24 can have a compressive strain or a tensile strain. For example, the Si layer (embedded Si island) 24 will have a compressive strain when the epitaxial stressor material 14 is SiGe; whereas, the Si layer (embedded Si island) 24 will have a tensile strain when the epitaxial stressor material 14 is SiC. Well implants 24a can be provided in the Si layer (embedded Si island) 24.

It should be recognized by those of skill in the art that the representation of the well implants 24a in FIG. 6 (and other embodiments) are merely representative of the formation of such implants. For example, the well implants 24a can extend to the underlying Si layer 12. It should be understood by those of skill in the art that the well implants 24a will be a P-well for an NFET and an N-well for a PFET. In embodiments, the well implants 24a can be, for example, boron for the PFET and phosphorous or arsenic for the NFET.

As in any of the embodiments, the well doping 24a can be done during or after the growth of the Si layer (embedded Si island) 24. For example, the well doping 24a can be formed during the growth of the Si layer (in-situ doping of the embedded Si island) 24 by controlling doping concentrations (gas concentrations) in the processing chamber. For example, by adjusting (e.g., increasing) the gas precursors, temperature and pressure in the processing chamber, the doping concentrations can be precisely controlled (and changed) during the growth process. In addition the doping concentrations can be controlled to form a gradient, e.g., a higher concentration at a top portion of the Si layer (embedded Si island) 24 and a lower concentration at a bottom portion of the Si layer or vice versa (embedded Si island) 24 resulting in retrograde well structures.

Alternatively, the doping or implantation of the well implants can be performed after the Si growth or controlled during the Si growth to have a uniform concentration. For example, in the latter process, the gas concentration during Si growth can remain constant to provide a uniform well.

In FIG. 6, a self-aligned gate structure is formed on the Si layer (embedded Si island) 24 by depositing material directly within the remaining portion of the trench 22a. The Si layer (embedded Si island) 24, which has a stress imposed by the epitaxial stressor material 14, forms the active channel region of the gate structure.

More specifically, a dielectric layer 26 is deposited on the Si layer (embedded Si island) 24. In embodiments, the dielectric layer 26 can be an oxide, hafnium based oxide or other high-k dielectric material or combination thereof. A gate body 28 is formed on the dielectric layer 26 using conventional deposition or sputtering processes, depending on the material of the gate body 28. In embodiments, the gate body 28 can be, for example, a metal or a poly-silicon material.

In further embodiments, back end of the line (BEOL) processes can be performed to complete the device. For example, the hardmask is removed and spacers formed on the side of the gate structure. The spacers can be, for example, oxide or nitride. Source and drain regions can be formed using conventional doping or implantation processes. Halo and extension regions can also be formed using conventional doping or implantation processes. Contacts, e.g., tungsten studs, can be formed in a dielectric layer, for example, to wiring layers. The contacts can be formed on the gate structure, as well as source and drain regions.

Figure 8:
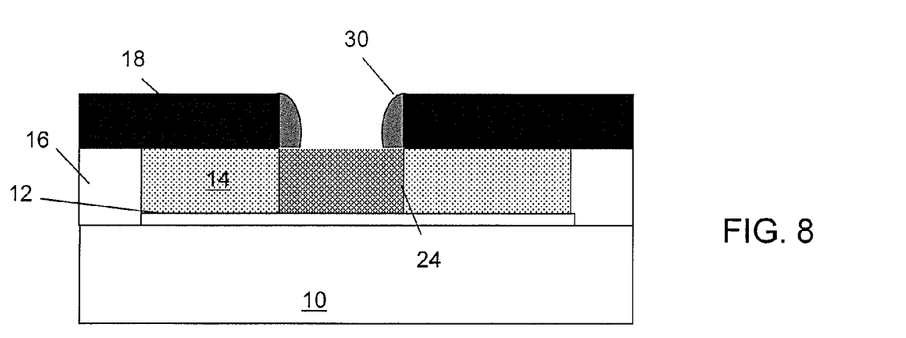
FIGS. 8 and 9 show structures and respective processing steps in accordance with additional aspects of the invention.
Figure 9:
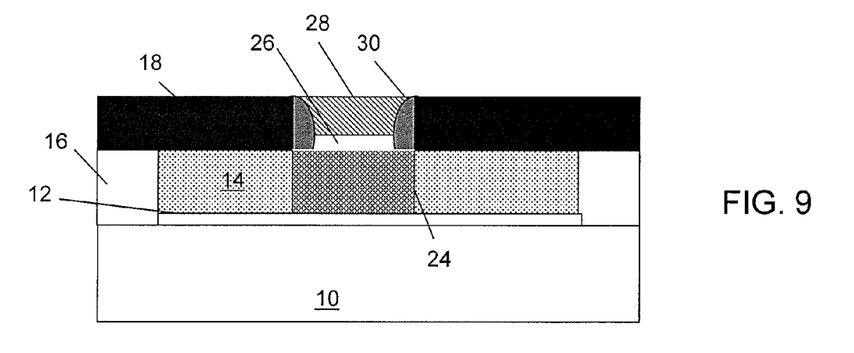

FIGS. 8 and 9 show structures and respective processing steps in accordance with additional aspects of the invention. Starting from the structure of FIG. 6, for example, spacers 30 can de deposited on the sidewalls of the hardmask 18 within the trench 22a, as shown in FIG. 8. In embodiments, the spacers 30 can be, for example, nitride, oxide or any other appropriate spacer material namely any other dielectric material. In embodiments, the spacers 30 can be formed by a conventional deposition process and subsequent etching step.

Figure 8A:
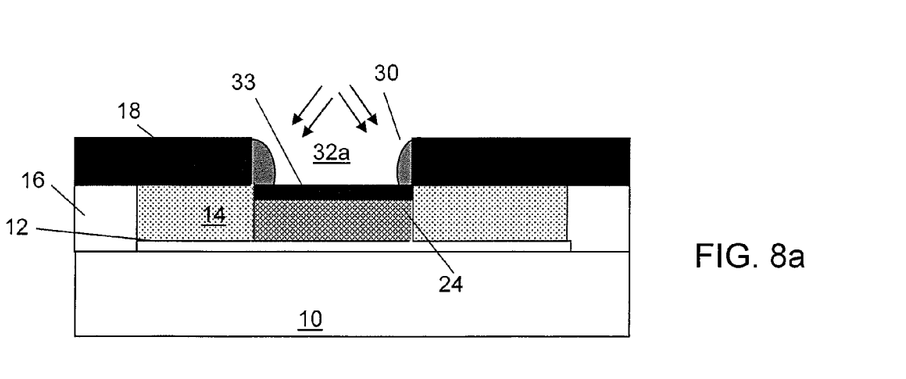
FIG. 8a shows optional processing steps and respective structure in accordance with additional aspects of the invention.

In optional processing steps, as shown in FIG. 8a, for example, angle halo, extension or combination of thereof implants 33 can be provided in the Si layer (embedded Si island) 24, prior to the formation of the gate structure. In embodiments, the halo implant 33 is provided to control short channel effects (SCE) and Vt. In embodiments, the angle halo implants can be provided in any of the embodiments of the present invention, with or without the well having a dopant gradient.

In FIG. 9, a self-aligned gate structure is formed on the Si layer (embedded Si island) 24 by depositing material directly within the remaining portion of the trench 22a. The Si layer (embedded Si island) 24, which has a stress imposed by the epitaxial stressor material 14, forms the active channel region of the gate structure. More specifically, a dielectric layer 26 is deposited on the Si layer (embedded Si island) 24, contacting the spacers 30. In embodiments, the dielectric layer 26 can be an oxide, hafnium based oxide or other high-k dielectric material or combination thereof. A gate body 28 is then formed on the dielectric layer 26 using conventional deposition or sputtering processes, depending on the material of the gate body 28. In embodiments, the gate body 28 can be, for example, a metal or a poly material.

In further embodiments, BEOL processes can be performed to complete the device, as described above. In these BEOL processes, the hardmask can be stripped, leaving behind the spacers 30. The source/drain, halo, and/or extension implants can then be formed on the device. Contacts, e.g., tungsten studs, can be formed in a dielectric layer, for example, to wiring layers. The contacts can be formed on the gate structure, as well as source and drain regions.

Figure 10:
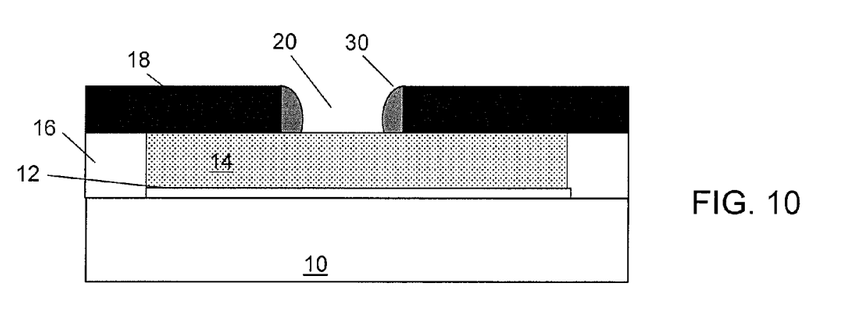
FIGS. 10-13 show structures and respective processing steps in accordance with additional aspects of the invention.

FIGS. 10-13 show structures and respective processing steps in accordance with additional aspects of the invention. Starting from the structure of FIG. 4, for example, spacers 30 are deposited on the sidewalls of the hardmask 18 within the trench opening 20, as shown in FIG. 10. In embodiments, the spacers 30 can be, for example, nitride, oxide or any other appropriate spacer material namely other dielectric material. In embodiments, the spacers 30 can be formed by a conventional deposition process and subsequent etching step.

Figure 11:
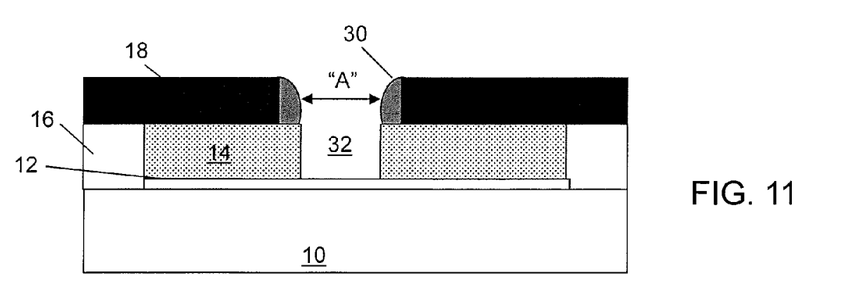

In FIG. 11, a trench 32 is formed in the epitaxial stressor material 14 using, for example, a plasma etching or RIE technique. The size of the trench 32 matches the space "A" between the spacers 30.

Figure 12:
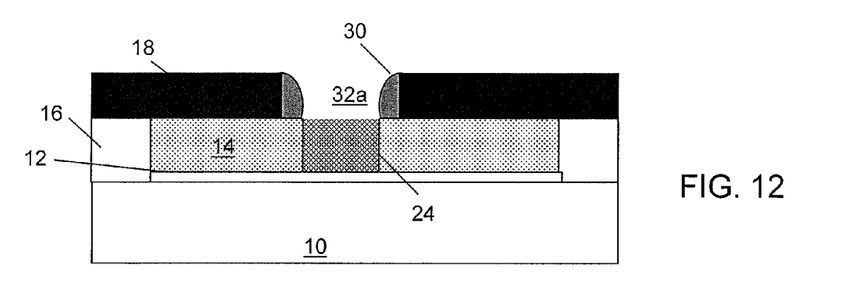

In FIG. 12, a Si layer 24 is grown in the trench 32 to form an embedded Si island. In embodiments, this process leaves a portion 32a of the trench remaining for subsequent gate formation. In embodiments, and as described above, a stress is imposed on the Si layer (embedded Si island) 24 as it is surrounded by the epitaxial stressor material 14, e.g., a compressive strain or a tensile strain. Also, in embodiments, well implants 24a can be formed in the Si layer (embedded Si island) 24, e.g., a P-well for an NFET and an N-well for a PFET, in any of the ways described above. In embodiments, the well implants 24a can be, for example, boron for the PFET and phosphorous or arsenic for the NFET, which can be formed as described above.

Figure 13:
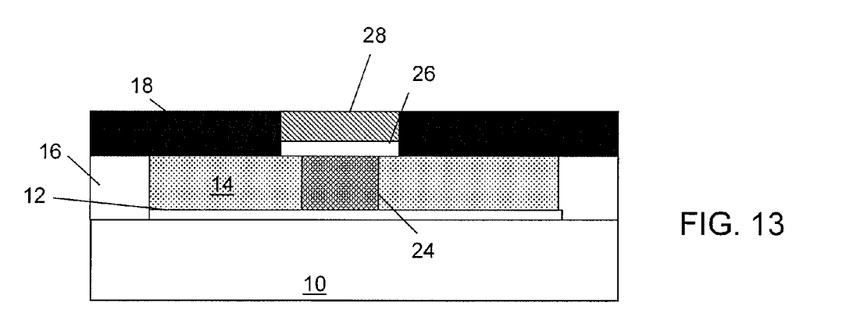

In FIG. 13, the spacers are removed and a self-aligned gate structure can now be formed on the Si layer (embedded Si island) 24 by depositing material directly within the remaining portion of the trench 32a. The Si layer (embedded Si island) 24, which has a stress imposed by the epitaxial stressor material 14, forms the active channel region of the gate structure. In embodiments, the gate structure will have a width dimension larger than the Si layer (embedded Si island) 24.

More specifically, a dielectric layer 26 is deposited on the Si layer (embedded Si island) 24. In embodiments, the dielectric layer 26 can be an oxide, hafnium based oxide or other high-k dielectric material or combination thereof. A gate body 28 is then formed on the dielectric layer 26 using conventional deposition or sputtering processes, depending on the material of the gate body 28. In embodiments, the gate body 28 can be, for example, a metal or a poly material. In further embodiments, BEOL processes are then performed to complete the device, as described above.

Figure 14:
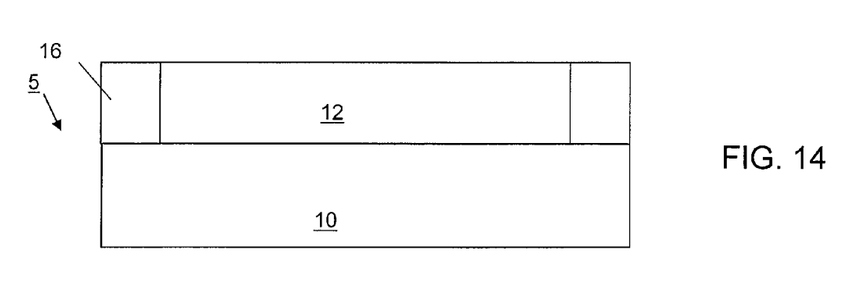
FIGS. 14-19 show structures and respective processing steps in accordance with accordance with aspects of the invention.

FIGS. 14-19 show structures and respective processing steps in accordance with accordance with aspects of the invention. Specifically, FIG. 14 shows a beginning structure comprising a silicon on insulator (SOI) substrate 5. The substrate 5 includes a silicon film 12 bonded or deposited to an oxide or other insulator material layer 10. Isolation regions 16 are formed using conventional lithographic, etching and deposition processes. For example, a resist can be deposited on the structure of FIG. 14, and exposed to light to form a pattern (openings). A RIE can then be performed to open trenches in the silicon film 12, exposing the underlying oxide or other insulator material layer 10. In embodiments, an oxide or other insulator material is then deposited in the trenches to form the isolation regions. The resist can then be stripped using conventional processes.

Figure 15:
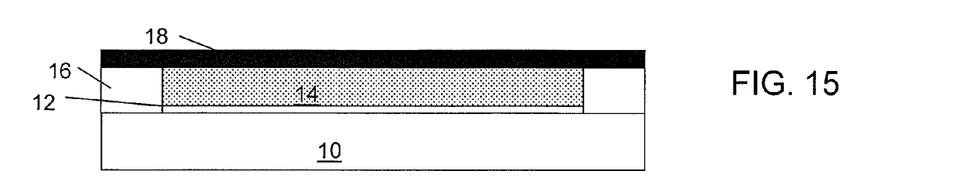

As shown in FIG. 15, the silicon film 12 is thinned by conventional processes. For example, a reactive ion etching (RIE) can be performed to thin the silicon film 12. In embodiments, the thickness of the silicon film 12 can be about 10 nm to about 40 nm. An epitaxial stressor material 14 is formed (e.g., deposited) on the silicon film 12. In embodiments, the epitaxial stressor material 14 is formed (e.g., deposited) to a thickness of about 20 nm to about 70 nm. In embodiments, the epitaxial stressor material 14 can be deposited using conventional deposition methods such as, for example, chemical vapor deposition (CVD), between the isolation regions 16. In embodiments, the epitaxial stressor material 14 can be, for example, SiGe to create a compressive stress for a PFET device or a SiC to create a tensile stress for an NFET device.

Still referring to FIG. 15, a hardmask 18 is placed over the isolation regions 16 and the epitaxial stressor material 14. In embodiments, the hardmask 18 can be deposited over the isolation regions 16 and the epitaxial stressor material 14. The hardmask 18 can be, for example, a nitride, oxide or multilayer mask.

Figure 16:
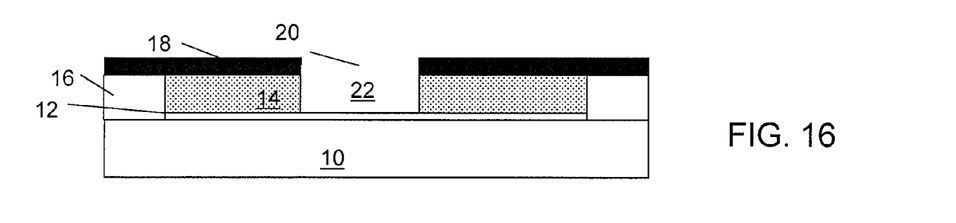

In FIG. 16, a pattern (opening) 20 is formed in the hardmask 18 using conventional lithographic and etching processes. The etching process can be, for example, a RIE or wet etching process, known to those of skill in the art. The size of the opening 20 can vary, depending on the size of the transistor. A trench 22 is formed in the epitaxial stressor material 14, exposing the underlying silicon film 12. In embodiments, the trench 22 can be formed by conventional plasma etching or RIE techniques.

Figure 17:
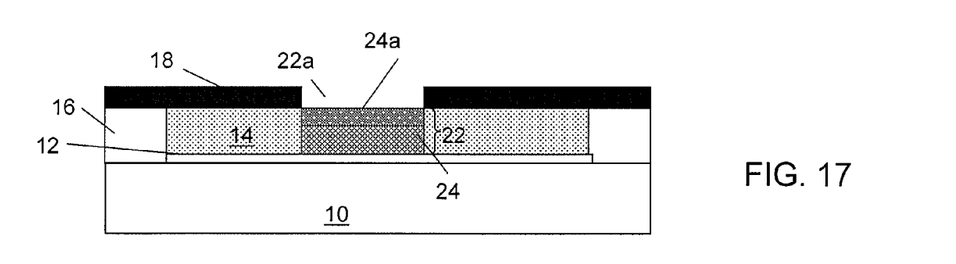

In FIG. 17, a Si layer 24 is grown in the trench 22 to form an embedded Si island. In embodiments, the growth of the Si layer (embedded Si island) 24 leaves a portion 22a of the trench remaining for subsequent gate formation. In embodiments, a stress is imposed on the Si layer (embedded Si island) 24 as it is surrounded by the epitaxial stressor material 14, e.g., a compressive strain or a tensile strain. For example, the Si layer (embedded Si island) 24 will have a compressive strain when the epitaxial stressor material 14 is SiGe; whereas, the Si layer (embedded Si island) 24 will have a tensile strain when the epitaxial stressor material 14 is SiC. In embodiments, well implants 24a can be formed in the Si layer (embedded Si island) 24, as described in any of the methods herein.

Figure 18:
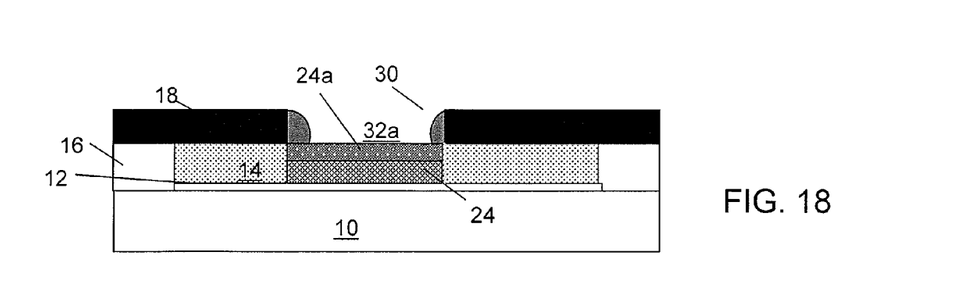

In FIG. 18, spacers 30 are deposited on the sidewalls of the hardmask 18 within the remaining portion of the trench 22a. In embodiments, the spacers 30 can be, for example, nitride, oxide or any other appropriate spacer material namely a dielectric material. In embodiments, the spacers 30 can be formed by a conventional deposition process and subsequent etching step.

Figure 19:
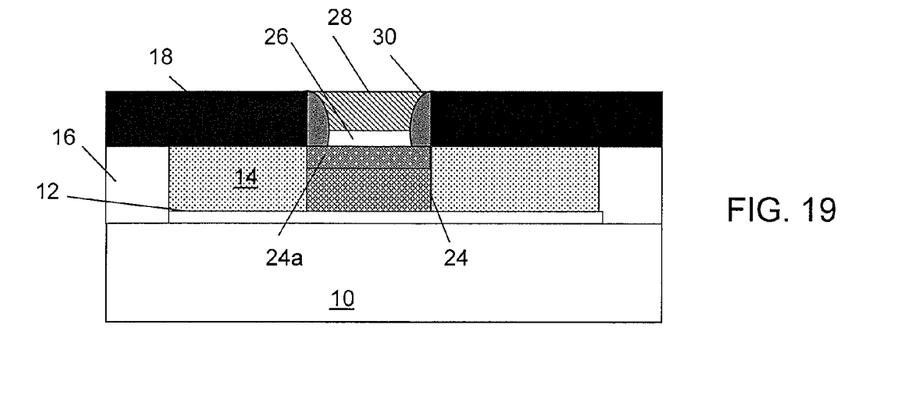

In FIG. 19, a self-aligned gate structure can now be formed on the Si layer (embedded Si island) 24 by depositing material directly within the remaining portion of the trench 22a. The Si layer (embedded Si island) 24, which has a stress imposed by the epitaxial stressor material 14, forms the active channel region of the gate structure. More specifically, a dielectric layer 26 is deposited on the Si layer (embedded Si island) 24, contacting the spacers 30. In embodiments, the dielectric layer 26 can be an oxide, hafnium based oxide or other high-k dielectric material or combination thereof. A gate body 28 is then formed on the dielectric layer 26 using conventional deposition or sputtering processes, depending on the material of the gate body 28. In embodiments, the gate body 28 can be, for example, a metal or a poly material. In further embodiments, BEOL process are performed to complete the device, as described above.

Figure 20:
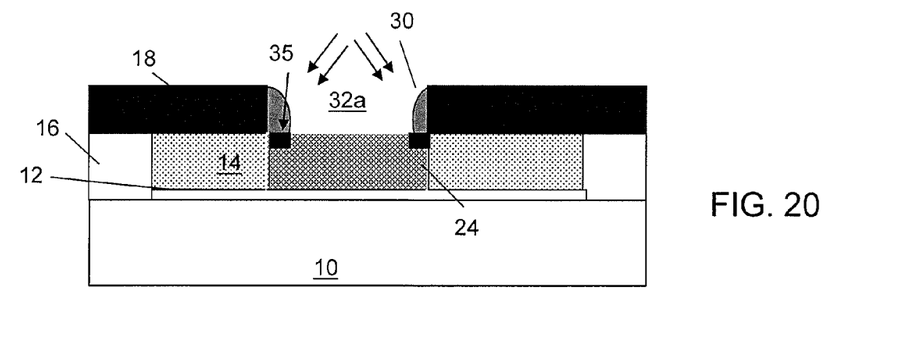
FIGS. 20-22 show structures and respective processing steps in accordance with additional aspects of the invention.
Figure 21:
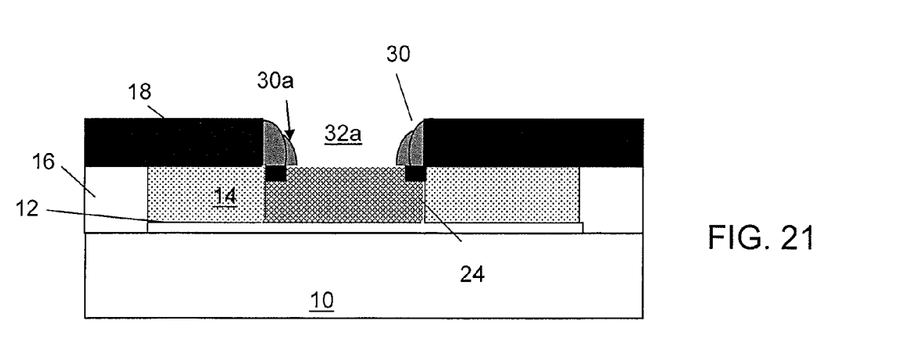
Figure 22:
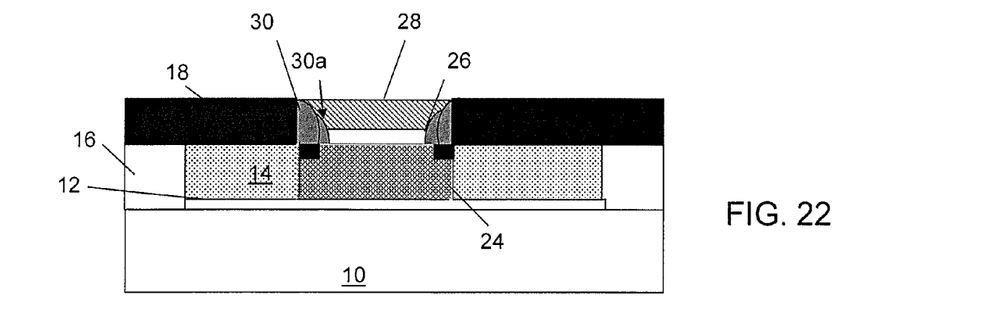
Figure 23:
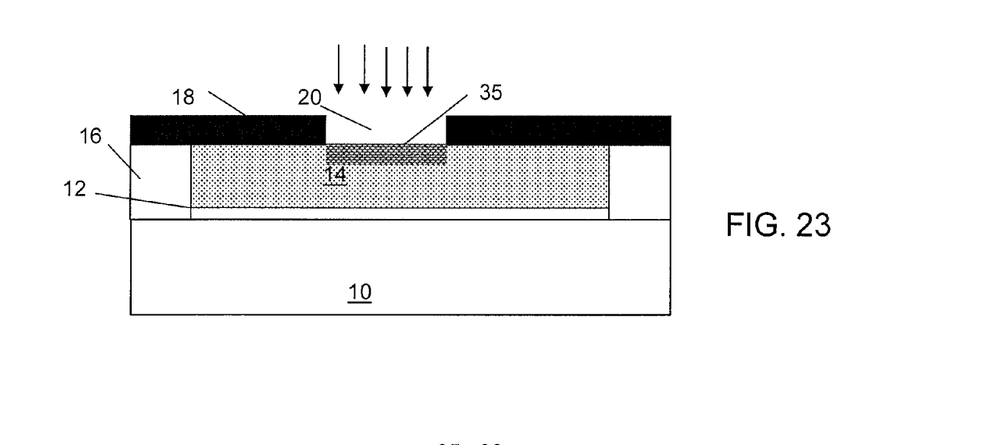
FIGS. 23-27 show structures and respective processing steps in accordance with additional aspects of the invention.

FIGS. 20-22 show structures and respective processing steps in accordance with additional aspects of the invention. Starting from the structure of FIG. 8, for example, halo or extension implants 35 can be provided in the Si layer (embedded Si island) 24, under the spacers 30, as shown in FIG. 20. In FIG. 21, an additional spacer 30a is formed on the spacers 30. In embodiments, the spacers 30a can be formed by the same processes as that for spacers 30. In embodiments, the spacers 30a can be, for example, nitride, oxide or any other appropriate spacer material such as, for example, TiN or other dielectric material. In FIG. 22, the self-aligned gate structure is formed in a conventional CMOS fabrication process, as described above. The Si layer (embedded Si island) 24, which has a stress imposed by the epitaxial stressor material 14, forms the active channel region of the gate structure.

Figure 24:
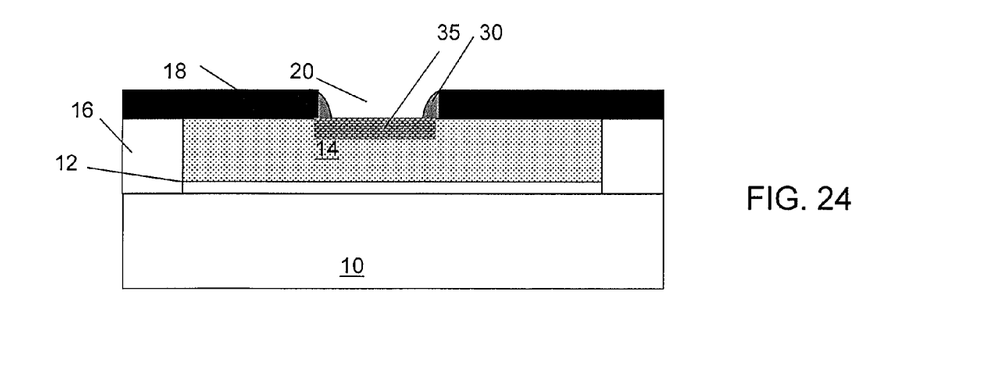

FIGS. 23-27 show structures and respective processing steps in accordance with additional aspects of the invention. Starting from the structure of FIG. 4, for example, implants 35 can be provided in the epitaxial stressor material 14, which is deposited on the silicon film 12. In FIG. 24, spacers 30 can de deposited on the sidewalls of the hardmask 18 within the trench 20. In embodiments, the spacers 30 can be, for example, nitride, oxide or any other appropriate spacer material namely any other dielectric material. In embodiments, the spacers 30 can be formed by a conventional deposition process and subsequent etching step.

Figure 25:
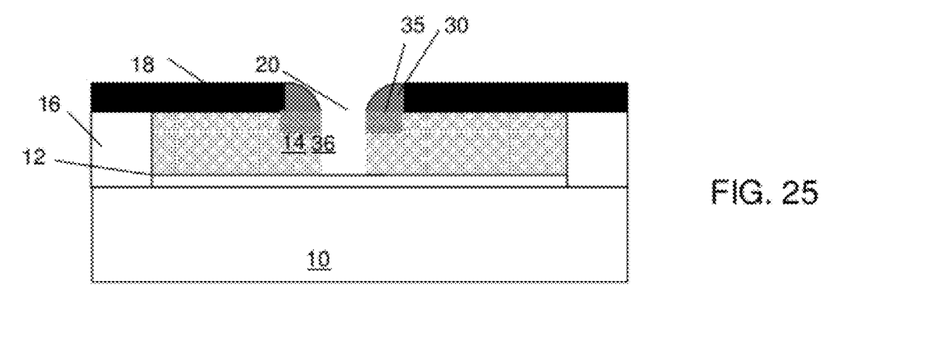

In FIG. 25, a trench 36 is etched into the epitaxial stressor material 14 and portions of the implants (doped area) 35 using conventional processes such as, for example, RIE. More specifically, as shown in FIG. 25, the etching will form a trench 36 to the underlying silicon film 12, removing doped area that is not protected by the spacer 30. This process leaves behind doped regions that will form the extension region 35'.

Figure 26:
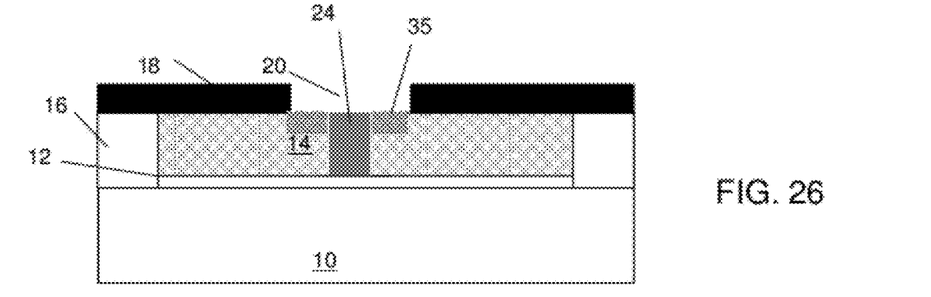

In FIG. 26, a Si layer 24 is grown in the trench 22 to form an embedded Si island. In embodiments, a stress is imposed on the Si layer (embedded Si island) 24 as it is surrounded by the epitaxial stressor material 14. In embodiments, the Si layer (embedded Si island) 24 can have a compressive strain or a tensile strain. For example, the Si layer (embedded Si island) 24 will have a compressive strain when the epitaxial stressor material 14 is SiGe; whereas, the Si layer (embedded Si island) 24 will have a tensile strain when the epitaxial stressor material 14 is SiC.

Figure 27:
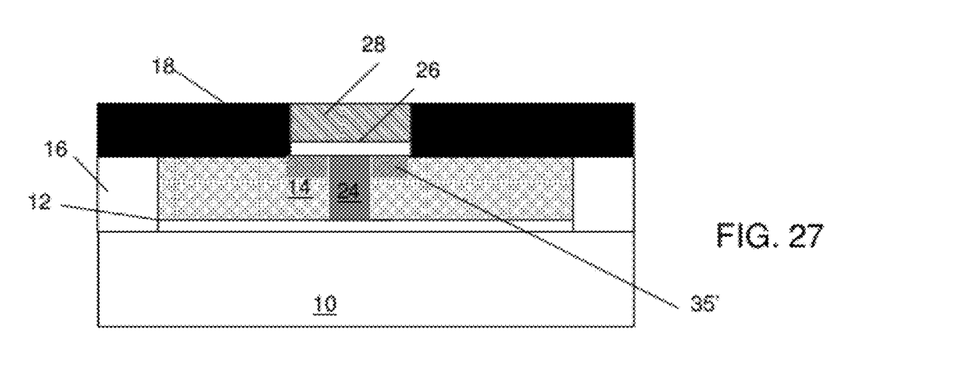

In FIG. 27, a dielectric layer 26 is deposited on the Si layer (embedded Si island) 24. In embodiments, the dielectric layer 26 can be an oxide, hafnium based oxide or other high-k dielectric material or combination thereof. A gate body 28 is formed on the dielectric layer 26 using conventional deposition or sputtering processes, depending on the material of the gate body 28. In embodiments, the gate body 28 can be, for example, a metal or a poly-silicon material.

Figure 28:
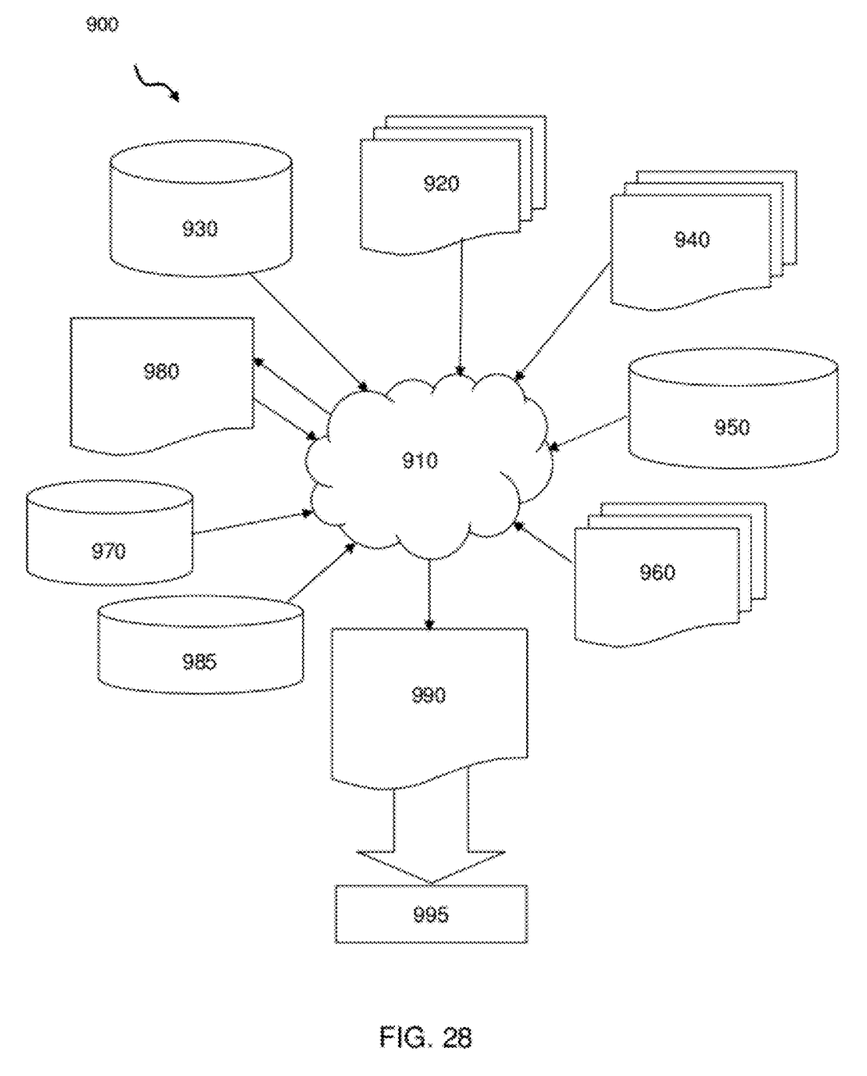
FIG. 28 is a flow diagram of a design process used in semiconductor design, manufacture, and/or test.

FIG. 28 is a flow diagram of a design process used in semiconductor design, manufacture, and/or test. FIG. 28 shows a block diagram of an exemplary design flow 900 used for example, in semiconductor IC logic design, simulation, test, layout, and manufacture. Design flow 900 includes processes, machines and/or mechanisms for processing design structures or devices to generate logically or otherwise functionally equivalent representations of the design structures and/or devices described above and shown in FIGS. 1-27. The design structures processed and/or generated by design flow 900 may be encoded on machine-readable transmission or storage media to include data and/or instructions that when executed or otherwise processed on a data processing system generate a logically, structurally, mechanically, or otherwise functionally equivalent representation of hardware components, circuits, devices, or systems. Machines include, but are not limited to, any machine used in an IC design process, such as designing, manufacturing, or simulating a circuit, component, device, or system. For example, machines may include: lithography machines, machines and/or equipment for generating masks (e.g. e-beam writers), computers or equipment for simulating design structures, any apparatus used in the manufacturing or test process, or any machines for programming functionally equivalent representations of the design structures into any medium (e.g. a machine for programming a programmable gate array).

Design flow 900 may vary depending on the type of representation being designed. For example, a design flow 900 for building an application specific IC (ASIC) may differ from a design flow 900 for designing a standard component or from a design flow 900 for instantiating the design into a programmable array, for example a programmable gate array (PGA) or a field programmable gate array (FPGA) offered by Altera® Inc. or Xilinx® Inc.

FIG. 28 illustrates multiple such design structures including an input design structure 920 that is preferably processed by a design process 910. Design structure 920 may be a logical simulation design structure generated and processed by design process 910 to produce a logically equivalent functional representation of a hardware device. Design structure 920 may also or alternatively comprise data and/or program instructions that when processed by design process 910, generate a functional representation of the physical structure of a hardware device. Whether representing functional and/or structural design features, design structure 920 may be generated using electronic computer-aided design (ECAD) such as implemented by a core developer/designer. When encoded on a machine-readable data transmission, gate array, or storage medium, design structure 920 may be accessed and processed by one or more hardware and/or software modules within design process 910 to simulate or otherwise functionally represent an electronic component, circuit, electronic or logic module, apparatus, device, or system such as those shown in FIGS. 1-27. As such, design structure 920 may comprise files or other data structures including human and/or machine-readable source code, compiled structures, and computer-executable code structures that when processed by a design or simulation data processing system, functionally simulate or otherwise represent circuits or other levels of hardware logic design. Such data structures may include hardware-description language (HDL) design entities or other data structures conforming to and/or compatible with lower-level HDL design languages such as Verilog and VHDL, and/or higher level design languages such as C or C++.

Design process 910 preferably employs and incorporates hardware and/or software modules for synthesizing, translating, or otherwise processing a design/simulation functional equivalent of the components, circuits, devices, or logic structures shown in FIGS. 1-27 to generate a netlist 980 which may contain design structures such as design structure 920. Netlist 980 may comprise, for example, compiled or otherwise processed data structures representing a list of wires, discrete components, logic gates, control circuits, I/O devices, models, etc. that describes the connections to other elements and circuits in an integrated circuit design. Netlist 980 may be synthesized using an iterative process in which netlist 980 is resynthesized one or more times depending on design specifications and parameters for the device. As with other design structure types described herein, netlist 980 may be recorded on a machine-readable data storage medium or programmed into a programmable gate array. The medium may be a non-volatile storage medium such as a magnetic or optical disk drive, a programmable gate array, a compact flash, or other flash memory. Additionally, or in the alternative, the medium may be a system or cache memory, buffer space, or electrically or optically conductive devices and materials on which data packets may be transmitted and intermediately stored via the Internet, or other networking suitable means.

Design process 910 may include hardware and software modules for processing a variety of input data structure types including netlist 980. Such data structure types may reside, for example, within library elements 930 and include a set of commonly used elements, circuits, and devices, including models, layouts, and symbolic representations, for a given manufacturing technology (e.g., different technology nodes, 32 nm, 45 nm, 90 nm, etc.). The data structure types may further include design specifications 940, characterization data 950, verification data 960, design rules 970, and test data files 985 which may include input test patterns, output test results, and other testing information. Design process 910 may further include, for example, standard mechanical design processes such as stress analysis, thermal analysis, mechanical event simulation, process simulation for operations such as casting, molding, and die press forming, etc. One of ordinary skill in the art of mechanical design can appreciate the extent of possible mechanical design tools and applications used in design process 910 without deviating from the scope and spirit of the invention. Design process 910 may also include modules for performing standard circuit design processes such as timing analysis, verification, design rule checking, place and route operations, etc.

Design process 910 employs and incorporates logic and physical design tools such as HDL compilers and simulation model build tools to process design structure 920 together with some or all of the depicted supporting data structures along with any additional mechanical design or data (if applicable), to generate a second design structure 990.

Design structure 990 resides on a storage medium or programmable gate array in a data format used for the exchange of data of mechanical devices and structures (e.g. information stored in a IGES, DXF, Parasolid XT, JT, DRG, or any other suitable format for storing or rendering such mechanical design structures). Similar to design structure 920, design structure 990 preferably comprises one or more files, data structures, or other computer-encoded data or instructions that reside on transmission or data storage media and that when processed by an ECAD system generate a logically or otherwise functionally equivalent form of one or more of the embodiments of the invention shown in FIGS. 1-27. In one embodiment, design structure 990 may comprise a compiled, executable HDL simulation model that functionally simulates the devices shown in FIGS. 1-27.

Design structure 990 may also employ a data format used for the exchange of layout data of integrated circuits and/or symbolic data format (e.g. information stored in a GDSII (GDS2), GL1, OASIS, map files, or any other suitable format for storing such design data structures). Design structure 990 may comprise information such as, for example, symbolic data, map files, test data files, design content files, manufacturing data, layout parameters, wires, levels of metal, vias, shapes, data for routing through the manufacturing line, and any other data required by a manufacturer or other designer/developer to produce a device or structure as described above and shown in FIGS. 1-27. Design structure 990 may then proceed to a stage 995 where, for example, design structure 990: proceeds to tape-out, is released to manufacturing, is released to a mask house, is sent to another design house, is sent back to the customer, etc.

The method as described above is used in the fabrication of integrated circuit chips. The resulting integrated circuit chips can be distributed by the fabricator in raw wafer form (that is, as a single wafer that has multiple unpackaged chips), as a bare die, or in a packaged form. In the latter case the chip is mounted in a single chip package (such as a plastic carrier, with leads that are affixed to a motherboard or other higher level carrier) or in a multichip package (such as a ceramic carrier that has either or both surface interconnections or buried interconnections). In any case the chip is then integrated with other chips, discrete circuit elements, and/or other signal processing devices as part of either (a) an intermediate product, such as a motherboard, or (b) an end product. The end product can be any product that includes integrated circuit chips, ranging from toys and other low-end applications to advanced computer products having a display, a keyboard or other input device, and a central processor.

The terminology used herein is for the purpose of describing particular embodiments only and is not intended to be limiting of the invention. As used herein, the singular forms "a", "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

The corresponding structures, materials, acts, and equivalents of all means or step plus function elements in the claims, if applicable, are intended to include any structure, material, or act for performing the function in combination with other claimed elements as specifically claimed. The description of the present invention has been presented for purposes of illustration and description, but is not intended to be exhaustive or limited to the invention in the form disclosed. Many modifications and variations will be apparent to those of ordinary skill in the art without departing from the scope and spirit of the invention. The embodiment was chosen and described in order to best explain the principals of the invention and the practical application, and to enable others of ordinary skill in the art to understand the invention for various embodiments with various modifications as are suited to the particular use contemplated. Accordingly, while the invention has been described in terms of embodiments, those of skill in the art will recognize that the invention can be practiced with modifications and in the spirit and scope of the appended claims.

What is claimed:

1. A method comprising:
   forming a Si film on an insulator layer;
   thinning the Si film;
   forming an epitaxial stress layer on an upper surface of the thinned Si film;
   forming a masking layer on the epitaxial stress layer and providing an opening therein;
   foaming a trench in the epitaxial stress layer through the opening of the masking layer, the trench ending at the upper surface of the thinned Si film;
   embedding a Si layer in the trench of the epitaxial stress layer, through the opening in the masking layer, the Si layer, which forms an active channel region of a gate structure, having a stress imposed thereon by the epitaxial stress layer; and
   forming the gate structure on the Si layer and within the opening formed in the masking layer,
   wherein the method further comprises, after the thinning the Si film, forming isolation regions having bottom surfaces directly on the insulator layer and top surfaces level with a top surface of the epitaxial stress layer.

2. The method of claim 1, wherein the embedding comprises growing the Si layer in the trench of the epitaxial stress layer.

3. The method of claim 1, wherein the epitaxial stress layer is SiGe or SiC, deposited on the thinned Si film.

4. The method of claim 1, further comprising:
   forming spacers within the opening on sidewalls of the masking layer; and
   performing a halo implant to form halo regions in the Si layer, under the spacers,
   wherein the gate structure comprises a dielectric material and a gate body within the opening formed in the masking layer and adjacent to the spacers.

5. The method of claim 4, further comprising forming additional spacers in the opening of the masking layer and on the spacers.

6. The method of claim 1, further comprising forming spacers within the opening on sidewalls of the masking layer, wherein the gate structure is formed after removal of the spacers.

7. The method of claim 1, further comprising forming spacers within the opening on sidewalls of the masking layer, and the gate structure is formed after the spacers are formed.

8. The method of claim 1, wherein:
   the trench in the epitaxial stress layer is formed after the formation of spacers, such that the trench has a width dimension that matches a spacing between the spacers; and
   the gate structure has a width dimension larger than the embedded Si layer.

9. The method of claim 1, further comprising forming a gradient well in the embedded Si layer during formation of the embedded Si layer.

10. The method of claim 1, wherein:
    the thinned Si film is a planar layer;
    the upper surface of the thinned Si film is an uppermost surface of the thinned Si film;
    the epitaxial stress layer is SiGe;
    the trench ends at the uppermost surface of the thinned Si film; and
    the embedding the Si layer in the trench comprises growing the Si layer on the uppermost surface of the thinned Si film.

11. The method of claim 1, wherein:
    the forming the masking layer further comprises forming the masking layer on the top surfaces of the isolation regions; and
    the isolation regions and the epitaxial stress layer separate the masking layer from the thinned Si film.

12. A method comprising:
    forming a Si film on an insulator layer;
    thinning the Si film;
    forming a stressed Si layer in a trench formed in a stress layer deposited on an upper surface of the thinned Si film, the trench ending at the upper surface of the thinned Si film, and the stressed Si layer forming an active channel region of a device, wherein the trench is formed by providing a hardmask on the stress layer, providing an opening in the hardmask, and etching through the opening, and into the stress layer to form the trench;
    forming spacers within the opening on sidewalls of the hardmask;
    after the thinning the Si film and forming the stress layer, forming isolation regions having bottom surfaces directly on the insulator layer and top surfaces level with a top surface of the stress layer; and
    forming a gate structure in the active channel region formed from the stressed Si layer.

13. The method of claim 12, wherein the stress layer is SiGe or SiC, which surrounds the stressed Si layer, and the stress layer is formed on the thinned Si film.

14. The method of claim 12, wherein:
    the trench in the stress layer is formed after the formation of the spacers, such that the trench has a width dimension that matches a spacing between the spacers;
    the gate structure has a width dimension larger than the embedded Si layer; and
    the gate structure is formed after removal of the spacers.

15. The method of claim 14, further comprising performing a halo implant to form halo and/or extension regions in the stressed Si layer, under the spacers.

16. The method of claim 15, further comprising forming additional spacers in the opening of the hardmask and on the spacers.

17. The method of claim 15, further comprising forming the gate structure comprising a dielectric material and a gate body within the opening formed in the hardmask and adjacent to the spacers.

18. The method of claim 12, further comprising forming a gradient well in the stressed Si layer during formation of the stressed Si layer by adjusting a concentration of gases within a processing chamber.

19. A method comprising:
    forming a Si film on an insulator layer;
    thinning the Si film;
    forming an epitaxial stress layer on the thinned Si film;
    forming a masking layer on the epitaxial stress layer and providing an opening therein;
    forming a trench in the epitaxial stress layer through the opening of the masking layer;
    embedding a Si layer in the trench of the epitaxial stress layer, through the opening in the masking layer, the Si layer, which forms an active channel region of a gate structure, having a stress imposed thereon by the epitaxial stress layer; and forming the gate structure on the Si layer and within the opening formed in the masking layer, wherein the method further comprises, after thinning the Si film, forming isolation regions having bottom surfaces directly on the insulator layer and top surfaces level with a top surface of the epitaxial stress layer.

* * * * *